United States Patent
Lee et al.

(10) Patent No.: US 7,656,382 B2
(45) Date of Patent: Feb. 2, 2010

(54) SHIFT REGISTER AND LIQUID CRYSTAL DISPLAY DEVICE USING THE SAME

(75) Inventors: Kyung Eon Lee, Suwon-si (KR); Juhn Suk Yoo, Seocho-gu (KR)

(73) Assignee: LG Display Co., Ltd., Seoul (KR)

( * ) Notice: Subject to any disclaimer, the term of this patent is extended or adjusted under 35 U.S.C. 154(b) by 592 days.

(21) Appl. No.: 11/477,350

(22) Filed: Jun. 30, 2006

(65) Prior Publication Data

US 2007/0001990 A1 Jan. 4, 2007

(30) Foreign Application Priority Data

Jun. 30, 2005 (KR) .................. 10-2005-0057952

(51) Int. Cl.
*G09G 3/36* (2006.01)
(52) U.S. Cl. .................. 345/100; 377/54; 377/57
(58) Field of Classification Search .............. 345/100; 377/57–88, 54
See application file for complete search history.

(56) References Cited

U.S. PATENT DOCUMENTS

| 5,400,050 A * | 3/1995 | Matsumoto et al. ......... 345/100 |
| 6,181,312 B1 * | 1/2001 | Sekine ........................ 345/98 |
| 2007/0008272 A1 * | 1/2007 | Li et al. ...................... 345/100 |

* cited by examiner

*Primary Examiner*—Amare Mengistu
*Assistant Examiner*—Koosha Sharifi
(74) *Attorney, Agent, or Firm*—McKenna Long & Aldridge LLP

(57) ABSTRACT

A shift register having a plurality of stages in which each of the stages includes: an input circuit part arranged to receive an input signal; an exclusive OR circuit arranged to generate a toggle signal by an exclusive OR operation on a non-inversion output and an inversion output of the input circuit part; and an output circuit part arranged to supply one of a clock signal and a feedback signal from an output terminal to the output terminal and an input terminal of the next stage in response to the toggle signal.

9 Claims, 9 Drawing Sheets

SHIFT REGISTER AND LIQUID CRYSTAL DISPLAY DEVICE USING THE SAME

This application claims the benefit of Korean Patent Application No. P2005-0057952, filed on Jun. 30, 2005, which is hereby incorporated by referenced for all purposes as if fully set forth herein.

BACKGROUND OF THE INVENTION

1. Field of the Invention

The present invention relates to a liquid crystal display device and more particularly to a shift register with low capacitance loading with overlapping outputs and a liquid crystal display device using the same.

1. Discussion of the Related Art

A liquid crystal display device controls the light transmittance of liquid crystal cells in accordance with a video signal to display a picture.

In an active matrix type liquid crystal display device, active switching devices are used to control the electric fields in each liquid crystal cell to control the light transmittance of the cell. By controlling the active switching devices, moving images can be displayed. Thin film transistors (hereinafter, referred to as 'TFTs') are primarily used as the switching devices in an active matrix type liquid crystal display device.

Figure 1:
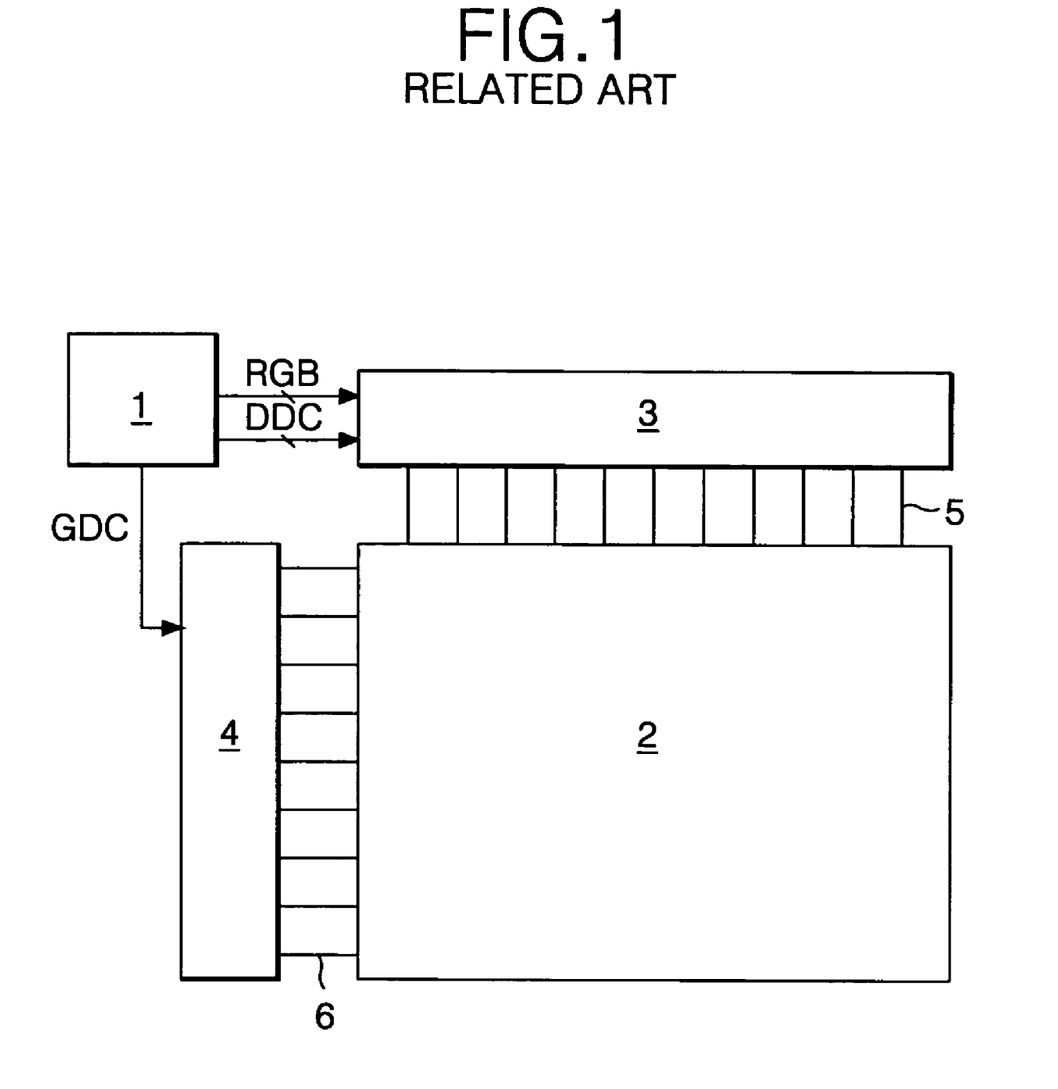
FIG. 1 is a black diagram briefly illustrating a liquid crystal display device.

A liquid crystal display device of the related art, as shown in FIG. 1, includes a liquid crystal display panel 2 having a plurality of data lines 5 crossing a plurality of gate lines 6 with TFTs for driving liquid crystal cells formed at the crossings of the gate and data lines; a data driver 3 for supplying data to the data lines 5; a gate driver 4 for supplying a scan pulse to the gate lines 6; and a timing controller 1 for controlling the data driver 3 and the gate driver 4.

The liquid crystal display panel 2 includes liquid crystal injected between two glass substrates. The data lines 5, gate lines 6 and TFTs are formed on a lower of the two glass substrates. The TFTs supply the data from the data lines 5 to the liquid crystal cell in response to the scan pulse from the gate lines 6. To this end, a gate electrode of the TFT is connected to the gate line 6, a source electrode is connected to the data line 5, and, a drain electrode of the TFT is connected to a pixel electrode of the liquid crystal cell Clc. Further, a storage capacitor Cst for maintaining the voltage of the liquid crystal cell is formed on the lower glass substrate of the liquid crystal display panel The data driver 3 includes a plurality of data integrated circuits hereinafter, referred to as 'ICs'), and each of the data ICs includes a shift register; a register for temporarily storing stretched digital video data RGB from the timing controller 1; a latch for storing the data line by line and outputting the stored data of one line at the same time in response to a clock signal from the shift register; a digital/analog converter for selecting a positive/negative analog gamma compensation voltage in correspondence to a digital data value from the latch; a multiplexer for selecting the data line 5 to which the positive/negative gamma compensation voltage is supplied; and an output buffer connected between the multiplexer and the data line. The data driver 3 supplies the digital video data RGB from the timing controller 1 to the data lines 5 of the liquid crystal display panel 7.

The gate driver 4 includes a shift register for sequentially generating a scan pulse in response to a gate control signal GDC from the timing controller 1; a level shifter for shifting a swing width of the scan pulse to a level suitable for driving the liquid crystal cell Clc; and an output buffer. The gate driver 4 supplies the scan pulse to the gate line 6 to turn on the TFTs connected to the gate line 6, thereby selecting the liquid crystal cells Clc of a horizontal line to which a pixel voltage of the data, i.e., analog gamma compensation voltage, is to be supplied. The data generated from the data driver 3 are supplied to the liquid crystal cell Clc of the horizontal line selected by the scan pulse.

The timing controller 1 receives a digital video data RGB, a horizontal synchronization signal H, a vertical synchronization signal H, and a clock signal CLK to generate a gate control signal GDC for controlling the gate driver 4 and a data control signal DDC for controlling the data driver 3. Further, the timing controller 1 supplies the data RGB to the data driver 3.

Figure 2:
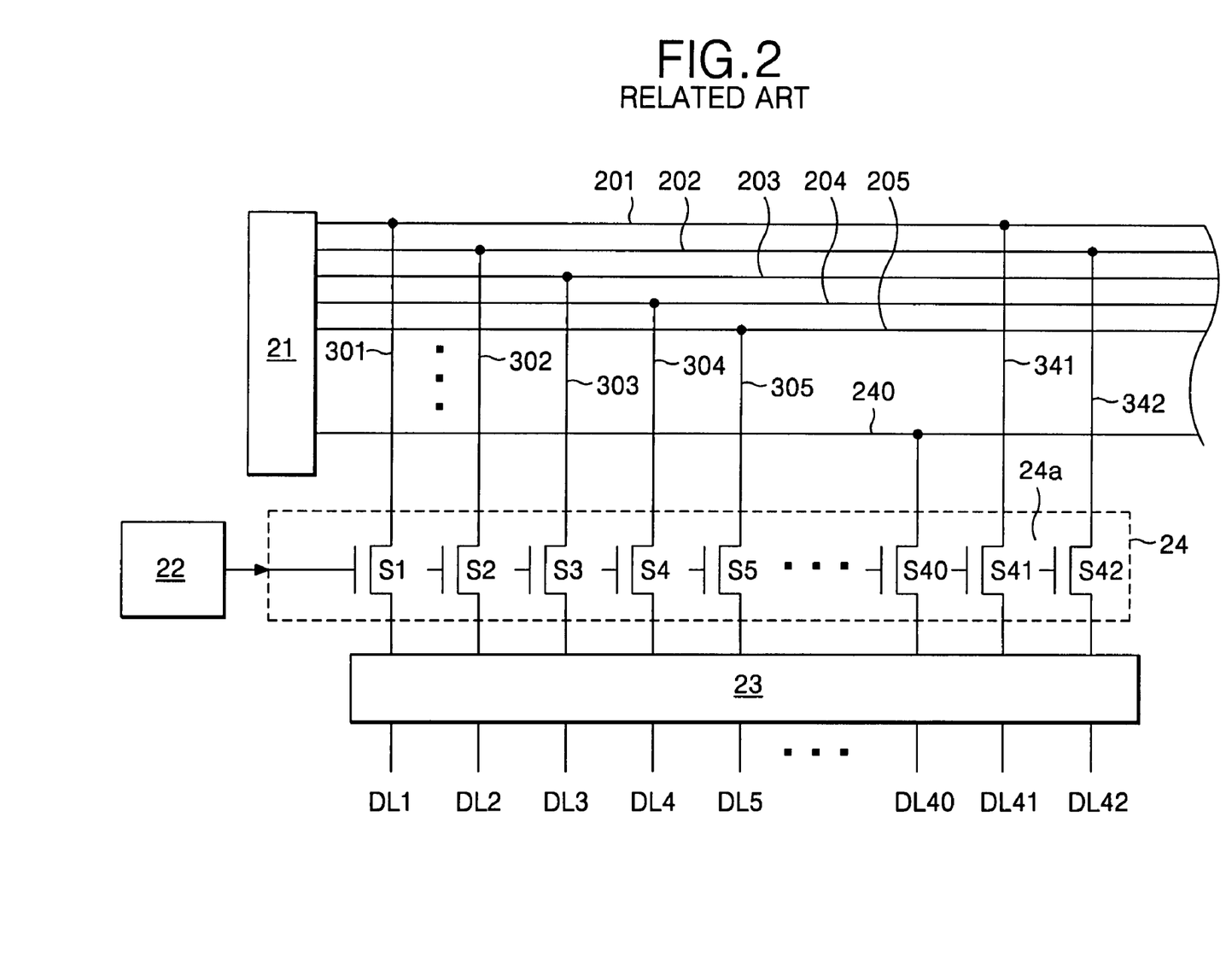
FIG. 2 is a block diagram illustrating an analog sampling & holding circuit.

On the other hand, in order to reduce the number of integrated circuits of the data driver, as shown in FIG. 2, there has been proposed a liquid crystal display device having common bus lines 201 to 240 connected to an output terminal of the data register 21 in a one-to-one relationship, and a channel selecting part 24 and a sampling & holding part 23 disposed between the common bus lines 201 to 240 and the data lines DL1 to DL42. A plurality of data output bus lines are formed in each of the common bus lines 201 to 240. For example, the first and 41$^{st}$ data output bus lines 301, 341 are connected to the first common bus line 201. The channel selecting part 24 includes a plurality of switch devices 24A that are connected to the data output bus lines 301 in the one-to-one relationship. The switch devices 24A for the channel selecting part 24 may be realized using CMOS structures and are sequentially turned on in response to the control signal from the shift register 22, thereby acting to supply the data from the data output bus lines 301 to the sampling & holding part 23. The sampling & holding part 23 sequentially samples and holds the data from the channel selecting part 24, and then simultaneously supplies the held data to the data lines DL1 to DL42.

Figure 3:
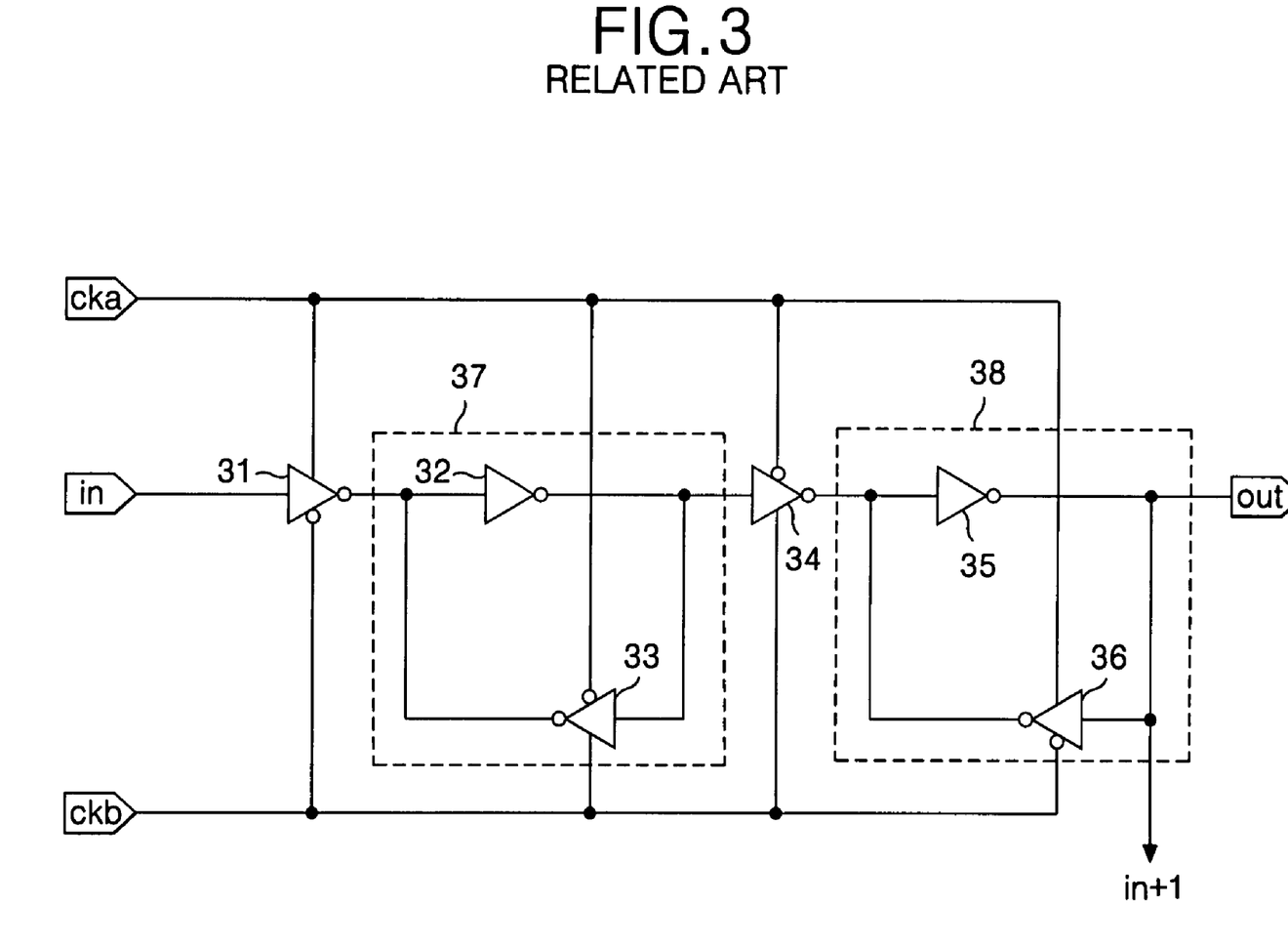
FIG. 3 is a circuit diagram of a shift register supporting output overlapping.
Figure 5:
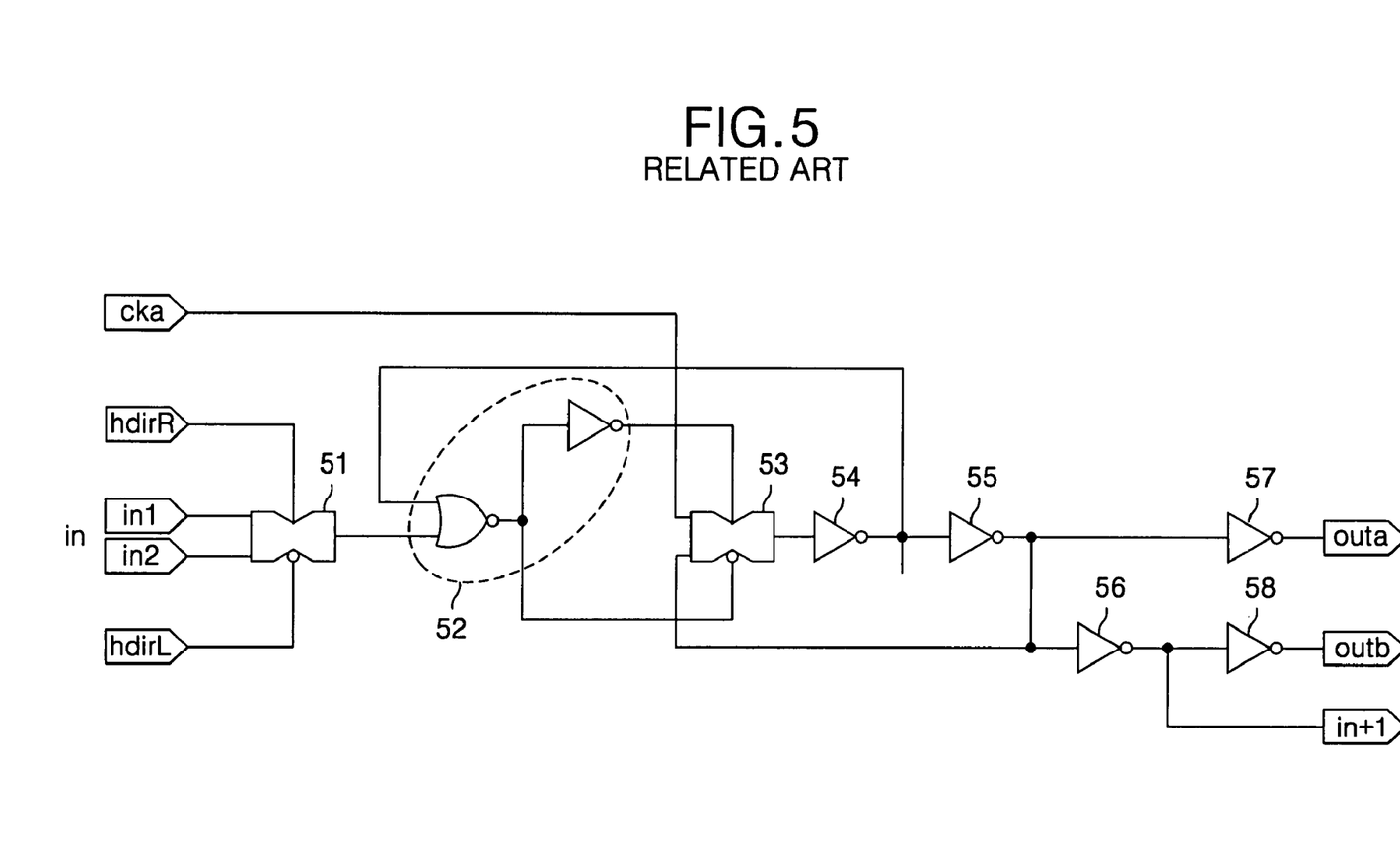
FIG. 5 is a circuit diagram illustrating an OR type stage for the shift register.

A shift register for making the switch devices 24A of the channel selecting part 24 sequentially operated may be realized as shown in FIG. 3 or FIG. 5.

Figure 4:
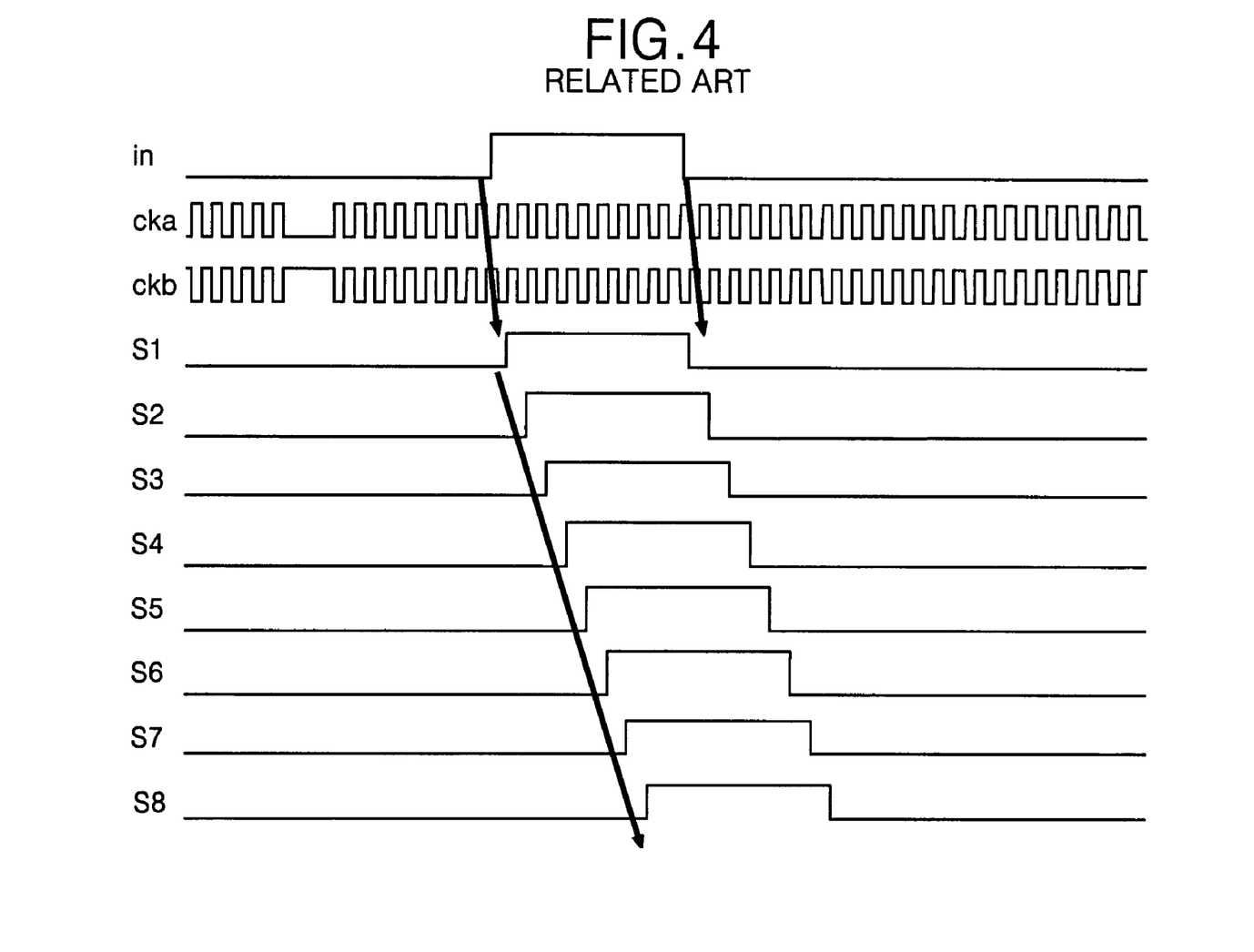
FIG. 4 is an input/output waveform diagram of a stage illustrated in FIG. 3.

FIG. 3 illustrates a stage configuration for a shift register 22 allowing overlapped output pulses. FIG. 4 illustrates input/output waveforms of the shift register 22 shown in FIG. 3.

Referring to FIG. 3 and 4, an arbitrary stage of the shift register 22 includes a first inverter type tri-state buffer 31, a first latch 37, a second inverter type tri-state buffer 34 and a second latch 38 disposed in cascade between an input terminal and an output terminal. Each stage of the shift register 22 outputs a start pulse or an output pulse (in) of a previous stage by delaying it for as much as one clock period in response to first and second clock signals (cka, ckb) which have opposite phases, and generates the output pulse (in) which overlaps the output pulse (in) of the previous stage by as much as one clock period.

The first clock signal (ckb) is inputted to a non-inversion control terminal of the first inverter type tri-state buffer 31 and the second clock signal (cka) is inputted to an inversion control terminal of the first inverter type tri-state buffer 31. The start pulse or the output pulse (in) of the previous stage is inputted to the input terminal. The first inverter type tri-state buffer 31 inverts the output pulse (in) of the previous stage or the start pulse to supply to the first latch 37 when the first clock signal (cka) of logic high is supplied to the non-inversion control terminal and the second clock signal (ckb) of logic low is supplied to the inversion control terminal. The first inverter type tri-state buffer 31 is changed to a high impedance state so as not to transmit the start pulse of the output pulse (in) of the previous stage to the first latch 37 when the first clock signal (cka) a logic low level is supplied to the non-inversion control terminal or the second clock signal (ckb) of logic high level is supplied to the inversion control terminal.

The first latch 37 includes a first inverter 32 and a third inverter type tri-state buffer 33 which are connected within a closed loop between the first inverter type tri-state buffer 31 and the second inverter type tri-state buffer 34. The first latch 37 latches the output of logic high, inverts the output and supplies the inverted output to the second inverter type tri-state buffer 34 when the output of the first inverter type tri-state buffer 31 is at logic high.

The second inverter type tri-state buffer 34 inverts the output from the first latch 37 to supply to the second latch when the second clock signal (ckb) of a logic high level is supplied to the non-inversion control terminal and the first clock signal (cka) of logic low level is supplied to the inversion control terminal at the same time.

The second latch 38 includes a second inverter 35 and a fourth inverter type tri-state buffer 36 which are connected within a closed loop between the second inverter type tri-state buffer 34 and an output terminal. The second latch 38 latches the output of logic high, inverts the output, and supplies the inverted output to the output terminal and simultaneously generates a start pulse (In+1) for the next shift register stage when the output of the second inverter type tri-state buffer 34 is at a logic high level.

As shown in FIG. 4, the outputs S1 to S42 of the stages are shifted while being overlapped by as much as one clock period. The outputs S1 to S42 sequentially turn on the switch devices 24A that are included in the channel selecting part 24 shown in FIG. 2.

The shift register configured with the stages as illustrated in FIG. 3 has an advantage that the operating speed of the channel selecting part 24 can be increased by the amount of the overlapping period between the shifted outputs. On the other hand, such a shift register has a problem that a capacitance between the gate terminal and the source/drain is relatively high because a clock signal line is connected to the gate terminal of an MOS TFT used for each of the inverter type tri-state buffers. The high capacitance generates signal delays that limit the usable frequency of the clock signal. Further, the high capacitance causes increased power consumption if the drive voltage is increased to operate at high speeds.

FIG. 5 illustrates one stage a shift register 22 having a configuration in which the output pulses are not overlapped.

Referring to FIG. 5, an arbitrary stage of the shift register 22 includes a first multiplexer 51, an OR circuit 52, a second multiplexer 53, and first to fifth inverters 54 to 58.

Each of the multiplexers 51 and 53 has a circuit configuration in which two transmission gates are symmetrically connected, and the multiplexer outputs an input signal applied to a first input terminal (in1) when a logic high signal is supplied to a non-inversion control terminal but outputs an input signal applied to a second input terminal (in2) when a logic high signal is supplied to an inversion control terminal.

The OR circuit 52 includes an NOR gate having two input terminals and an inverter. The output of the first inverter 54 is supplied to the second input terminal of the NOR gate as feedback and the output of the first multiplexer 51 is supplied to the first input terminal of the NOR gate. The OR circuit inverter inverts the output of the NOR gate. The OR circuit 52 generates an output which is a logical sum (OR) of the two input terminals to the NOR gate.

The shift register 22, using the shift register stages illustrated in FIG. 5, has an advantage that the capacitance load is low because the clock signal line is connected to the source/drain terminal of the MOS TFT which constitutes the transmission gate and because most of the MOS TFTs are in an off state during operation. However, a shift register 22 employing register stages as illustrated in FIG. 5 has the problem that outputs cannot be overlapped.

SUMMARY OF THE INVENTION

Accordingly, the present invention is directed to a shift register and a liquid crystal display device using the same that substantially obviates one or more of the problems due to limitations and disadvantages of the related art.

An advantage of the present invention is to provide a shift register having a low capacitance loading and allowing output overlapping, and a liquid crystal display device using the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a shift register having a plurality of stages is provided wherein each of the stages includes: an input circuit part arranged to receive an input signal; an exclusive OR circuit arranged to generate a toggle signal by an exclusive OR operation on a non-inversion output and an inversion output of the input circuit part; and an output circuit part arranged to supply one of a clock signal and a feedback signal from an output terminal to the output terminal and an input terminal of the next stage in response to the toggle signal, wherein each of the stages is arranged to generate output signals partially overlapped with output signals from other stages and of which the phases are sequentially shifted.

In another aspect of the present invention, liquid crystal display device, includes: a liquid crystal display panel having a plurality of data lines, a plurality of gate lines crossing the plurality of data lines, and a plurality of liquid crystal cells; a data driver to convert digital data into analog data; a channel selecting part arranged to sequentially select analog outputs of the data driver; a sampling and holding part arranged to sample the analog data from the channel selecting part to supply the sampled data to the data lines; and a gate driver-to sequentially supply gate pulses to the gate lines, wherein at least one of the data driver, the channel selecting part and the gate driver includes a shift register having a plurality of stages, each stage an input circuit part arranged to receive an input signal; an exclusive OR circuit arranged to generate a toggle signal by an exclusive OR operation on a non-inversion output and an inversion output of the input circuit part; and an output circuit part arranged to supply one of a clock signal and a feedback signal from an output terminal to the output terminal and an input terminal of the next stage in response to the toggle signal, wherein each of the stages is arranged to generate output signals partially overlapped with output signals from other stages and of which the phases are sequentially shifted.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Embodiments of the present invention will be explained hereinafter with reference to FIG. 6 to 9.

Figure 6:
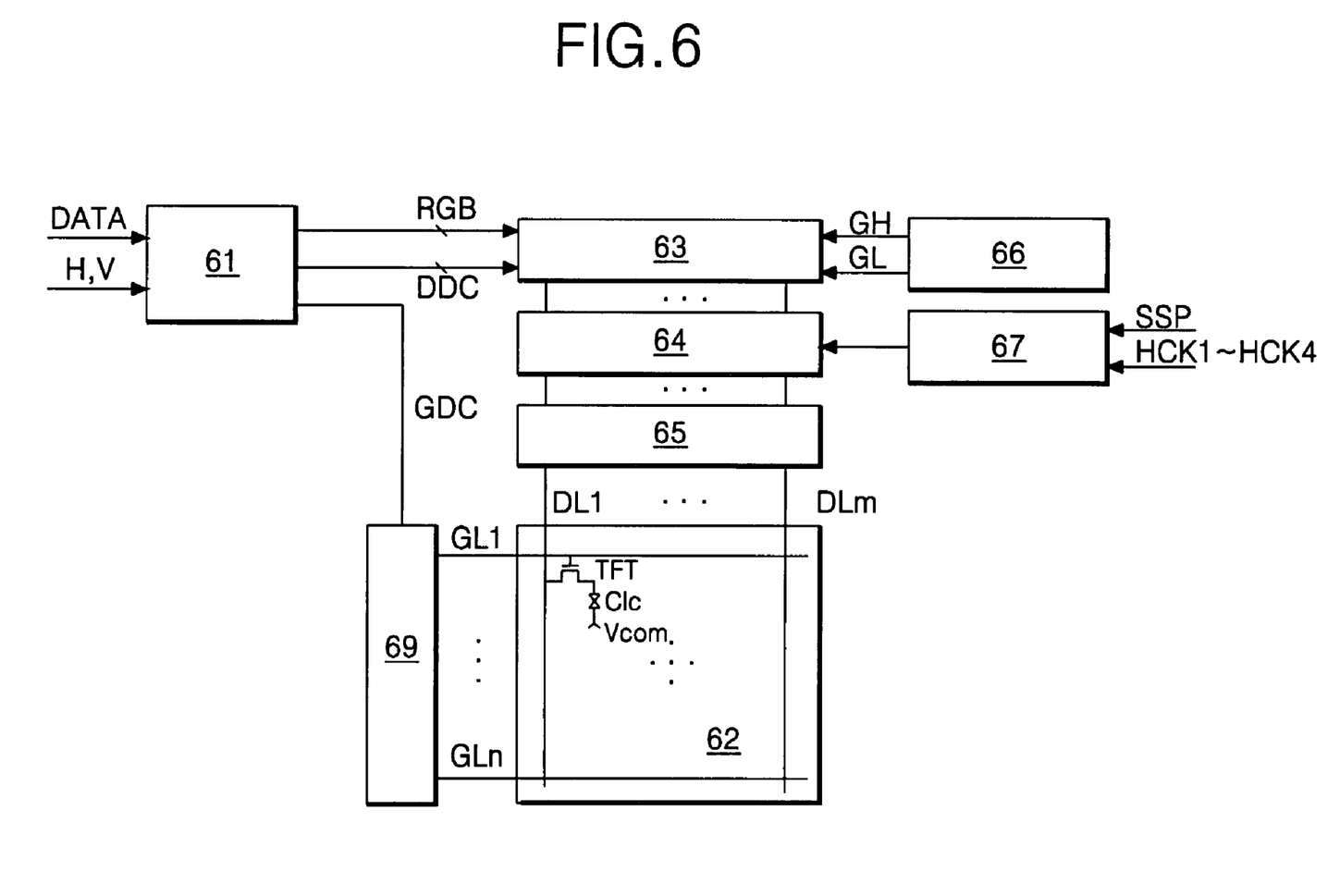
FIG. 6 is a block diagram illustrating a liquid crystal display device according to an embodiment of the present invention.

Referring to FIG. 6, a liquid crystal display device according to an embodiment of the present invention includes a liquid crystal display panel 62 having data lines DL1 to DLm which cross gate lines GL1 to GLn and TFTs for driving liquid crystal cells Clc formed at crossings of the data and gate lines; a data driver 63 for converting digital data RGB into an analog data voltage; a channel selecting part 64 and a sampling & holding part 65 disposed between the data driver 63 and the data lines DL1 to DLm of the liquid crystal display panel 62; a gate driver 69 for supplying a gate pulse to the gate lines GL1 to GLn of the liquid crystal display panel 62; a gamma reference voltage generator 66 for supplying a gamma reference voltage to the data driver 63; a timing controller 61 for controlling the data driver 63 and the gate driver 69; and a shift register 67 for controlling a sequential operation of the channel selecting part 64.

The liquid crystal display panel 62 includes a layer of liquid crystal between two glass substrates. The data lines DL1 to DLm and the gate lines GL1 to GLn cross each other on a lower of the two glass substrates of the liquid crystal display panel 62. A TFT is formed near the crossing of the data lines DL1 to DLm and the gate lines GL1 to GLn. The TFT supplies the data of the data lines DL1 to DLm to liquid crystal cells Clc in response to a gate pulse. To this end, a gate electrode of the TFT is connected to the gate line GL1 to GLm, a source electrode of the TFT is connected to the data line DL1 to DLm. A drain electrode of the TFT is connected to a pixel electrode in each liquid crystal cell Clc. Further, storage capacitors for maintaining the voltage of the liquid crystal cells are formed on the lower glass substrate of the liquid crystal display panel 62.

The timing controller 61 samples the digital video data supplied from a digital video card of a system (not shown) to supply to the data driver 63. Further, the timing controller 61 generates a data control signal DDC and a gate control signal GDC by use of horizontal and vertical synchronization signals H and V which are supplied to the timing controller 61. The data control signal DDC includes a source shift clock SSC, a source start pulse SSP, a polarity control signal POL, a source output enable signal SOE, etc, and is supplied to the data driver 63. The gate control signal GDC includes a gate start pulse GSP, a gate shift clock GSC, a gate output enable GOE, etc, and is supplied to the gate driver 69.

The gate driver 69 sequentially generates a scan pulse, i.e., a gate high pulse, in response to a gate drive control signal GDC supplied from the timing controller 61. The gate driver 69 includes a shift register that sequentially generates the scan pulse, and a level shifter that shifts a swing width of the voltage of the scan pulse to a range suitable for driving the liquid crystal cell Clc. The TFT is turned on in response to the scan pulse from the gate driver 69. When the TFT is turned on, the video data on the data line DL1 to DLm are supplied to the pixel electrode of the liquid crystal cell.

The gamma reference voltage generator 66 supplies a designated number of positive gamma reference voltages GH and a designated number of negative gamma reference voltages GL to the data driver 63. The positive gamma reference voltage GH and the negative gamma reference voltage GL are generated by use of voltage division resistances.

The data driver 63 supplies the data to the data lines DL1 to DLm in response to the data control signal DDC supplied from the timing controller 61. The data driver 63 samples the digital data RGB from the timing controller 61, latches the data, and then converts the data into the analog gamma voltage. The data driver 63 includes a plurality of data integrated circuits having a configuration as in FIG. 7.

The shift register 67 generates output signals that are overlapped and shifted, as a switch control signal of the channel selecting part 64 in response to the source start pulse SSP and any one of the clock signals HCK1 to HCK4.

The channel selecting part 64 may be realized using CMOS TFTs connected to the output terminal of the data driver 63 in a one-to-one relationship. The channel selecting part 64 includes a plurality of switch devices that supply the output of the data driver 63 to the sampling & holding part 65 in response to each of the overlapping and shifted output signals of the shift register 67.

The sampling & holding part 65 simultaneously supplies the analog voltages to the data lines DL1 to DLm after sampling and holding the analog data voltages from the channel selecting part 64.

Figure 7:
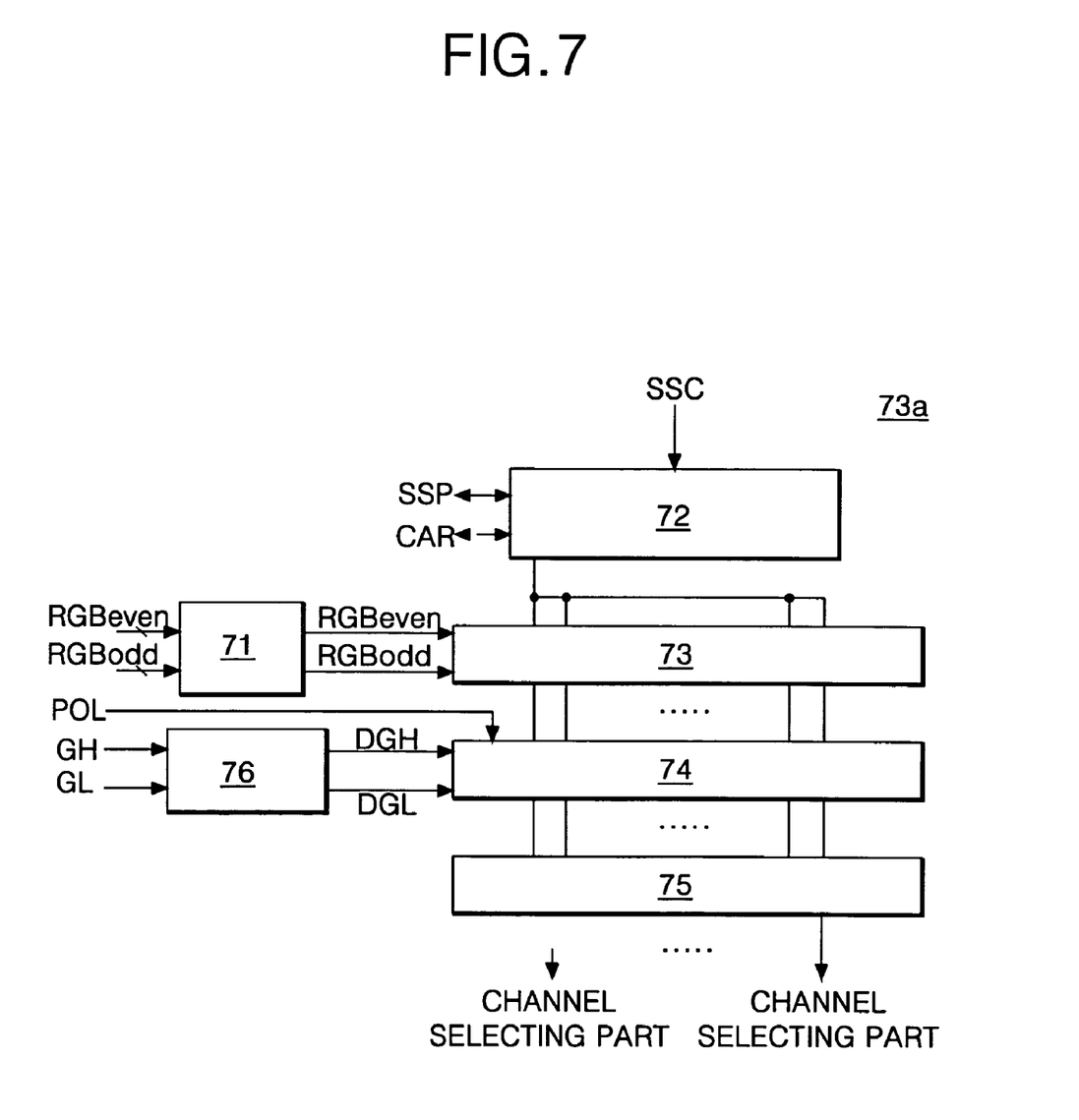
FIG. 7 is a block diagram illustrating a data driver shown in FIG. 6.

FIG. 7 is illustrates a data integrated circuit configuration of the data driver.

Referring to FIG. 7, the data integrated circuit includes a data register 71 to which the data RGB is inputted from the timing controller 61; a shift register 72 for generating a sampling clock; a latch 73 connected between the shift register 72 and k (where, k is an integer less than m, the number of data lines of the liquid crystal display panel) number of data lines DL1 to DLk; a digital to analog converter (hereinafter, referred to as 'DAC') 74; an output buffer 75; and a gamma voltage supplier 76 connected between the gamma reference voltage generator 66 and the DAC 74.

The shift register 72 shifts the source start pulse SSP from the timing controller 61 to generate a sampling signal in accordance with the source sampling signal SSC. Further, the shift register 72 shifts the source start pulse SSP to transmit a carry signal CAR to the shift register 72 of a next data integrated circuit.

The latch 73 sequentially samples the data RGB from the data register 71 to latch line by line in response to the sampling signal sequentially inputted from the shift register 72, and then simultaneously outputs the sampled data in response to the source output enable signal SOE.

The DAC 74 converts the data from the latch 73 into an analog gamma voltage DGH, DGL from the gamma voltage supplier 76. The gamma voltage DGH, DGL is an analog voltage corresponding to a graylevel of the digital input data.

The gamma voltage supplier 76 subdivides the gamma reference voltage inputted from the gamma reference voltage generator 66 to supply the gamma voltage corresponding to the gray level to the DAC 74. The gamma voltage supplier 76 comprises a circuit for generating a positive gamma voltage and a circuit for generating a negative gamma voltage.

The embodiment of the present invention as described with reference to FIG. 6 and 7 sequentially samples a fixed number of digital data and generates the analog signal by transmitting the data latched at the latch 73 to the DAC 74, as compared to the data driver of the related art which includes a first latch for sampling the data line sequentially; a second latch for latching the data from the first latch while the voltage is converted by the DAC. For example, if the designed number of data lines is 240 (as in a QVGA display) and the number of latches 73 and DACs 74 is 40, a converting time of the DAC 74 and a charging time of the data line is about 1/6 of one horizontal time 1H (=40/240). The output of the DAC 74 is transmitted to a $40^{th}$ data line by each of the channel selecting part 64 and the sampling & holding part 65 which are sequentially opened for about H/6 period. For example, the first DAC 74 sequentially charges and maintains 40n+1 (where n=0, 1, 2, 3, 4, and 5) data lines with an interval of H/6 time period. The channel selecting part 64 is configured similarly to a one bank analog driving method of the related art, as shown in FIG. 2, and thus a brightness non-uniformity phenomenon associated with a bank boundary generated when a plurality of banks are used does not occur. The number of the latches 73 and DACs 74 are reduced to 1/6 in comparison with the data driver of the digital driving method of the related art, thus allowing the circuitry to be embedded in a relatively small area. Further, the external digital data signal RGB may be applied directly to the data driver 63 without passing through the timing controller 61, allowing further simplification of the timing controller 61 circuitry.

Figure 8:
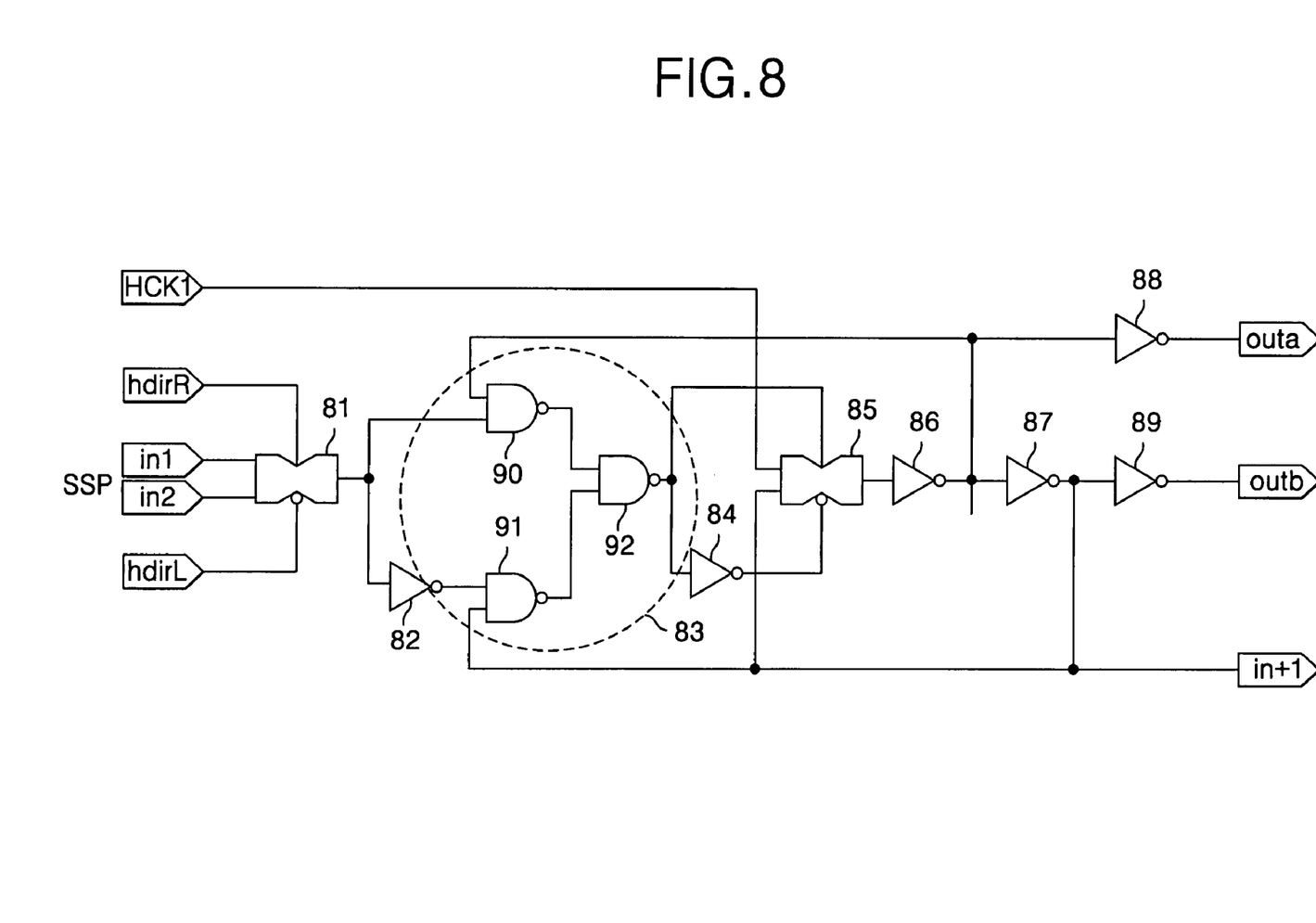
FIG. 8 is a circuit diagram illustrating a stage of a shift register shown in FIG. 6.
Figure 9:
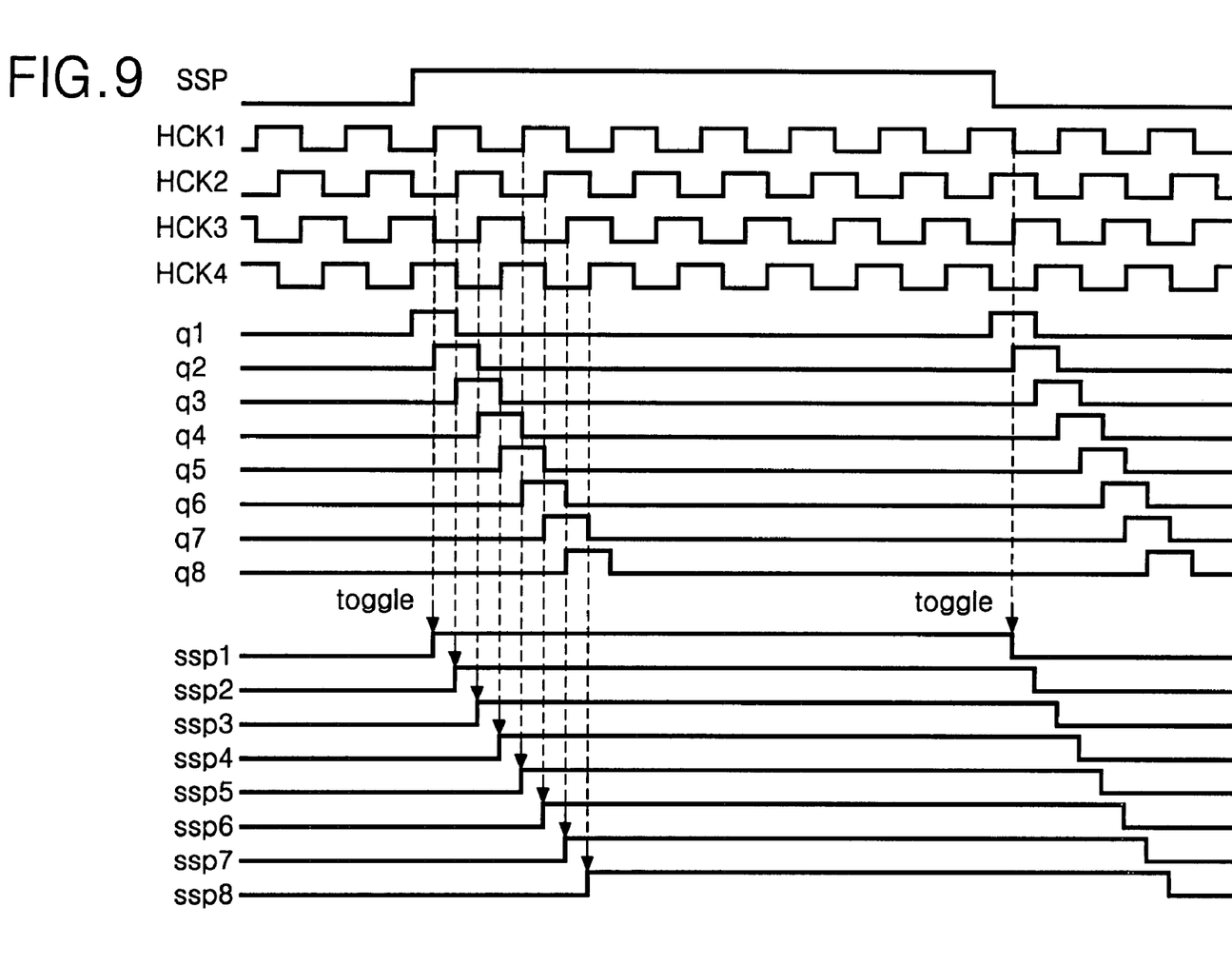
FIG. 9 is an input/output waveform diagram of the stage shown in FIG. 8.

FIG. 8 illustrates the configuration of a stage of the shift register 67 shown in FIG. 6. FIG. 9 illustrates input/output waveforms of the stage shown in FIG. 8. A detail configuration and operation of a shift register stage will be explained assuming that the stage is a first stage of the shift register 67.

Referring to FIG. 8, a first stage of the shift register 67 includes a first multiplexer 81, a first inverter 82, an exclusive OR circuit 83, a second inverter 84, a second multiplexer 85 and third to sixth inverters 86 to 89 that are disposed in cascade between an input terminal and an output terminal.

Each of the multiplexers 81 and 85 has a circuit configuration in which two transmission gates are symmetrically connected, and the multiplexer outputs an input signal of a first input terminal (in1) when a logic high signal is supplied to a non-inversion control terminal and outputs an input signal of a second input terminal (in2) when a logic high signal is supplied to an inversion control terminal.

The source start pulse SSP is inputted to the first and second input terminals (in1, in2) of the first multiplexer 81, and a control signal is inputted to the non-inversion control terminal and inversion control terminal of the first multiplexer 81.

The first inverter 82 is connected between an output node of the first multiplexer 81 and the input terminal of one side of the exclusive OR circuit 83 and inverts the output of the first multiplexer 81 to supply to the input terminal of one side of the exclusive OR circuit 83.

The exclusive OR circuit 83 outputs a toggle signal (q1) by performing an XOR operation on the output of the first multiplexer 81 and the output of the first inverter 82. To this end, the exclusive OR circuit 83 includes three NAND gates 90, 91, and 92. The first NAND gate 90 performs a NAND operation on feedback input from the third inverter 86 and the output of the first multiplexer 81 to supply a signal to a second input terminal of the third NAND gate 92, and the second NAND gate 91 performs a NAND operation on the output of the first inverter 82 and a feedback input from the fourth inverter 87 to supply to a first input terminal of the third NAND gate 92. The third NAND gate 92 performs a NAND operation on the outputs from the first NAND gate 90 and the second NAND gate 91.

The second inverter 84 is connected between the exclusive OR circuit 83 and the second multiplexer 85 to invert the output of the exclusive OR circuit 83 to supply to the inversion control terminal of the second multiplexer 85.

The second multiplexer 85 outputs a clock signal HCK1 when the toggle signal (q1) inputted to the non-inversion control terminal is a logic high, and outputs the feedback from the fourth inverter 87 when the output of the second inverter 84 inputted to the inversion control terminal is a logic high signal.

The third inverter 86 inverts the output of the second multiplexer 85 and inputs to the second input terminal of the first NAND gate 90 of the exclusive OR circuit 83 to toggle the toggle signal (q1). The fourth inverter 87 inverts the output of the third inverter 86 and inputs to the second input terminal (in2) of the second multiplexer 85 and the second input terminal of the second NAND gate 91 to toggle the toggle signal (q1).

The output of the fourth inverter 87 is supplied to a start pulse input terminal of the next stage as a start pulse of the next stage.

The fifth inverter 88 inverts the output of the third inverter 86 and the inverted signal is output as a control signal of a pMOS FET that constitutes a part of the CMOS of the channel selecting part 64.

The sixth inverter 89 inverts the output of the fourth inverter 87 and the inverted signal is output as a control signal of an nMOS FET that constitutes part of the CMOS of the channel selecting part 64.

The output of the stage generates overlapped output signals SI to S8, wherein the output signals are shifted as much as the toggle signals (q1-q8) are overlapped in adjacent stages, as shown in FIG. 9. The output signals S1 to S8 sequentially turn on the switch devices of the channel selecting part 64.

In the shift register stage described above, the first toggle signal (q1) is generated at a rising time of the source start pulse SSP to generate the output as a logic high, while the second toggle signal (q2) is generated at a falling time of the source start pulse SSP to invert the output to a logic low. The stage of FIG. 8 has a very low capacitance loading because the clock signal line is connected to the source/drain terminal of the TFT, which constitutes the second multiplexer 85 and the second multiplexer 85 remains in an off state excluding one or two stages in which the toggle signal is generated.

The shift register according to the present invention can be applied as the shift register of the data driver 63 and/or the gate driver 69, as well as the shift register for controlling the channel selecting part.

As described above, the shift register and the liquid crystal display device using the same according to the present invention have a low capacitance load and overlapping outputs, thereby enabling improved (higher) the driving speeds.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a liquid crystal display panel having a plurality of data lines, a plurality of gate lines crossing the plurality of data lines, and a plurality of liquid crystal cells;
   a data driver to convert digital data into analog data;
   a channel selecting part arranged to sequentially select analog outputs of the data driver;
   a sampling and holding part arranged to sample the analog data from the channel selecting part to supply the sampled data to the data lines; and
   a gate driver to sequentially supply gate pulses to the gate lines,
   wherein at least one of the data driver and the gate driver includes a shift register having a plurality of stages, each stage includes an input circuit part arranged to receive an input signal; an exclusive OR circuit arranged to generate a toggle signal by an exclusive OR operation on a non-inversion output and an inversion output of the input circuit part; and an output circuit part arranged to supply one of a clock signal and a first feedback signal from a fourth inverter to an input terminal of the next stage in response to the toggle signal, wherein each of the stages is arranged to generate output signals partially overlapped with output signals from other stages and of which the phases are sequentially shifted;
   wherein the input circuit part includes a first multiplexer arranged to receive the input signal; and a first inverter arranged to invert an output signal from the first multiplexer;
   wherein the exclusive OR circuit includes a first NAND gate arranged to generate an output by a NAND operation on an output signal of the first multiplexer and a second feedback signal from a third inverter; a second NAND gate arranged to generate an output by a NAND operation on an output signal from the first inverter and the first feedback signal from the fourth inverter; and a third NAND gate arranged to generate an output by a NAND operation on output signals from the first and second NAND gates.

2. The liquid crystal display device according to claim 1, wherein the output circuit part includes:
   a second inverter arranged to invert an output from the third NAND gate;
   a second multiplexer arranged to output one of the clock signal and the first feedback signal from the fourth inverter in response to the output from the third NAND gate and an output signal from the second inverter;
   a third inverter arranged to invert an output signal from the second multiplexer to generate the second feedback signal, wherein the third inverter inputs the second feedback signal to a first NAND gate of the exclusive OR circuit to toggle a toggle signal (q1);
   a fourth inverter arranged to invert an output signal from the third inverter to generate the first feedback signal, wherein the fourth inverter inputs the first feedback signal to the second multiplexer and a second NAND gate arranged to toggle the toggle signal (q1);
   a fifth inverter arranged to invert the second feedback signal from the third inverter and to output the second feedback signal inverted by the fifth inverter as a control signal; and
   a sixth inverter arranged to invert the first feedback signal from the fourth inverter and to output the first feedback signal inverted by the sixth inverter as the control signal.

3. The liquid crystal display device according to claim 2, wherein the signal inverted by the fifth inverter is to control as a control signal of pMOS FET constituting a CMOS of the channel selecting part.

4. The liquid crystal display device according to claim 2, wherein the signal inverted by the sixth inverter is to control a control signal of nMOS FET constituting a CMOS of the channel selecting part.

5. The liquid crystal display device according to claim 2, wherein the output of the fourth inverter is to supply a start pulse of another stage.

6. A shift register for driving a liquid crystal display device having a plurality of stages, wherein each of the stages includes:
   an input circuit part arranged to receive an input signal;
   an exclusive OR circuit arranged to generate a toggle signal by an exclusive OR operation on a non-inversion output and an inversion output of the input circuit part; and
   an output circuit part arranged to supply one of a clock signal and a first feedback signal from a fourth inverter to an input terminal of the next stage in response to the toggle signal,
   wherein each of the stages is arranged to generate output signals partially overlapped with output signals from other stages and of which the phases are sequentially shifted;
   wherein the input circuit part includes a first multiplexer arranged to receive the input signal; and a first inverter arranged to invert an output signal from the first multiplexer;
   wherein the exclusive OR circuit includes a first NAND gate arranged to generate an output by a NAND operation on an output signal of the first multiplexer and a second feedback signal from a third inverter; a second NAND gate arranged to generate an output by a NAND operation on an output signal from the first inverter and the first feedback signal from the fourth inverter; and a third NAND gate arranged to generate an output by a NAND operation on output signals from the first and second NAND gates.

7. The shift register according to claim 6, wherein the output circuit part includes:
   a second inverter arranged to invert an output from the third NAND gate;
   a second multiplexer arranged to output one of the clock signal and the first feedback signal from the fourth inverter in response to the output from the third NAND gate and an output signal from the second inverter;
   a third inverter arranged to invert an output signal from the second multiplexer to generate the second feedback signal, wherein the third inverter inputs the second feedback signal to a first NAND gate of the exclusive OR circuit to toggle a toggle signal (q1);
   a fourth inverter arranged to invert an output signal from the third inverter to generate the first feedback signal, wherein the fourth inverter inputs the first feedback signal to the second multiplexer and a second NAND gate arranged to toggle the toggle signal ((q1);

a fifth inverter arranged to invert the second feedback signal from the third inverter and to output the second feedback signal inverted by the fifth inverter as a control signal; and a sixth inverter arranged to invert the first feedback signal from the fourth inverter and to output the first feedback signal inverted by the sixth inverter as the control signal.

8. The shift register according to claim 7, wherein an output signal from the fourth inverter is supplied as a start pulse of another stage.

9. A method for driving a liquid crystal display comprising:

providing a shift register having a sequence of stages;

receiving an input signal in an input circuit of a first stage of the sequence of stages;

generating a toggle signal using an exclusive OR operation on a non-inversion output and an inversion output of the input circuit of the first stage;

supplying one of a clock signal and a feedback signal from a fourth inverter to an input terminal of the next stage in response to the toggle signal; and generating an output signal from the first stage partially overlapped with an output signal generated from a next stage of the sequence of stages, wherein output signals from the sequence of stages are sequentially shifted;

wherein the input circuit includes a first multiplexer arranged to receive the input signal; and a first inverter arranged to invert an output signal from the first multiplexer;

wherein the exclusive OR operation is accomplished by a exclusive OR circuit;

wherein the exclusive OR circuit includes a first NAND gate arranged to generate an output by a NAND operation on an output signal of the first multiplexer and a second feedback signal from a third inverter; a second NAND gate arranged to generate an output by a NAND operation on an output signal from the first inverter and the first feedback signal from the fourth inverter; and a third NAND gate arranged to generate an Output by a NAND operation on output signals from the first and second NAND gates.

* * * * *